United States Patent
Wang

(10) Patent No.: US 7,622,352 B2
(45) Date of Patent: Nov. 24, 2009

(54) MULTI-STEP GATE STRUCTURE AND METHOD FOR PREPARING THE SAME

(75) Inventor: Ting Sing Wang, Hsinchu (TW)

(73) Assignee: Promos Technologies Inc., Hsinchu (TW)

(*) Notice: Subject to any disclaimer, the term of this patent is extended or adjusted under 35 U.S.C. 154(b) by 75 days.

(21) Appl. No.: 11/440,075

(22) Filed: May 25, 2006

(65) Prior Publication Data
US 2007/0215915 A1 Sep. 20, 2007

(30) Foreign Application Priority Data
Mar. 15, 2006 (TW) .............................. 95108685 A

(51) Int. Cl.
*H01L 21/336* (2006.01)
(52) U.S. Cl. .............................. 438/270; 257/E21.429
(58) Field of Classification Search .......... 257/E21.431, 257/E21.429; 438/270
See application file for complete search history.

(56) References Cited

U.S. PATENT DOCUMENTS

| | | | |
|---|---|---|---|
| 5,920,094 A * | 7/1999 | Nam ........................... | 257/347 |
| 6,844,589 B2 | 1/2005 | Kim | |
| 6,852,597 B2 * | 2/2005 | Park et al. ............ | 257/E29.259 |
| 6,861,716 B1 | 3/2005 | Hyde | |
| 6,867,078 B1 | 3/2005 | Green et al. | |
| 6,869,868 B2 | 3/2005 | Chiu et al. | |
| 6,995,418 B2 * | 2/2006 | Spitzer ....................... | 257/302 |
| 7,268,391 B2 * | 9/2007 | Park ........................... | 257/330 |
| 2004/0262699 A1 * | 12/2004 | Rios et al. .................. | 257/401 |
| 2005/0121720 A1 * | 6/2005 | Sin et al. ..................... | 257/341 |
| 2005/0233513 A1 * | 10/2005 | Kim et al. ................... | 438/197 |
| 2006/0063332 A1 | 3/2006 | Doyle et al. | |
| 2007/0278625 A1 * | 12/2007 | Masuoka et al. ............ | 257/623 |

FOREIGN PATENT DOCUMENTS

| | | |
|---|---|---|
| TW | 256940 | 9/1995 |
| TW | 488018 | 5/2002 |
| TW | 588365 | 5/2004 |

OTHER PUBLICATIONS

Quirk et al., Semiconductor Manufacturing Technology, Prentice Hall, Upper Saddle River, NJ, 2001, p. 476.*

* cited by examiner

*Primary Examiner*—W. David Coleman
*Assistant Examiner*—Sun M Kim
(74) *Attorney, Agent, or Firm*—Oliff & Berridge, PLC

(57) ABSTRACT

A multi-step gate structure comprises a semiconductor substrate having a multi-step structure, a gate oxide layer positioned on the multi-step structure and a conductive layer positioned on the gate oxide layer. Preferably, the gate oxide layer has different thicknesses on each step surface of the multi-step structure. In addition, the multi-step gate structure further comprises a plurality of doped regions positioned in the semiconductor substrate under the multi-step structure. The channel length of the multi-step gate structure is the summation of the lateral width and the vertical depth of the multi-step gate structure, which is dramatically increased such that problems originated from the short channel effect can be effectively solved. Further, the plurality of doped regions under the multi-step structure are prepared by implanting processes having different dosages and dopants, which can control the thickness of the gate oxide layer and the threshold voltage of the multi-step gate structure.

10 Claims, 5 Drawing Sheets

MULTI-STEP GATE STRUCTURE AND METHOD FOR PREPARING THE SAME

BACKGROUND OF THE INVENTION (A) Field of the Invention

The present invention relates to a multi-step gate structure and method for preparing the same, and more particularly, to a multi-step gate structure having an increased channel length by incorporating a semiconductor substrate with multi-step structure and method for preparing the same.

(B) Description of the Related Art

FIG. 1 illustrates a metal-oxide-semiconductor field effect transistor (MOSFET) 10 according to the prior art. The transistor 10 is an important basic electronic device including a gate 20 consisting of a semiconductor substrate 12, a gate oxide layer 14 and a conductive metal layer 16, and two doped regions 18 serving as the source and the drain in the semiconductor substrate 12 at two sides of the gate 20. The transistor 10 may further include a nitride spacer 22 positioned on the sidewall of the conductive metal layer 16 for isolating the conductive metal layer 16 from the other electronic devices on the semiconductor substrate 12.

As semiconductor fabrication technology continues to improve, sizes of electronic devices are reduced, and the size and the channel length of the transistor 10 also decrease correspondingly. The transistor 10 has been widely used in the integrated circuit; however, the decreasing of the size and the channel length of the transistor 10 results in a serious interaction between the two doped regions 18 and a carrier channel 24 in the semiconductor substrate 12 under the gate oxide layer 14 such that the controlling ability of the conductive metal layer 16 on the switching operation of the carrier channel 24 is reduced, i.e., causes the so-called short channel effect, which impedes the functioning of the transistor 10.

SUMMARY OF THE INVENTION

One aspect of the present invention provides a multi-step gate structure having an increased channel length by incorporating a semiconductor substrate with a multi-step structure and method for preparing the same, which can adjust the threshold voltage of a transistor using the multi-step gate structure by controlling the thickness of a gate oxide layer on each step surface of the multi-step structure or by controlling the dopant concentration and types of the dopants in the semiconductor substrate under the multi-step structure.

A multi-step gate structure according to this aspect of the present invention comprises a semiconductor substrate having a multi-step structure including at least a first depression and a second depression, a gate oxide layer positioned on the multi-step structure and a conductive layer positioned on the gate oxide layer. Preferably, the thickness of the gate oxide layer on one step surface of the multi-step structure may be different from the thickness of the gate oxide layer on another step surface of the multi-step structure. In addition, the multi-step gate structure may comprise a plurality of doped regions positioned in the semiconductor substrate under the multi-step structure.

Another aspect of the present invention provides a method for preparing a multi-step gate structure comprising the steps of forming a semiconductor substrate having a multi-step structure, performing a thermal oxidation process to form a gate oxide layer on the multi-step structure and forming a conductive layer on the gate oxide layer. The step of forming a semiconductor substrate having a multi-step structure forms a mask layer covering a predetermined portion of the semiconductor substrate, and the mask layer is used as a first etching mask in an etching process to remove a portion of the semiconductor substrate not covered by the first etching mask to form a first depression. Subsequently, a first spacer is formed on a sidewall of the first depression by deposition and etching processes, and the mask layer and the first spacer are used as a second etching mask in another etching process to remove a portion of the semiconductor substrate not covered by the second etching mask to form a second depression.

In addition, the step of forming a semiconductor substrate having a multi-step structure may further comprise a plurality of implanting processes to implant dopants into the semiconductor substrate under the multi-step structure, wherein the plurality of implanting processes may be performed with different dosages and different types of dopants. Particularly, the dopants used in the implanting processes are nitrogen-containing dopants selected from the group consisting of ions of nitrogen atom, nitrogen gas, nitrous oxide and nitric oxide, which can inhibit the reaction rate of the subsequent thermal oxidation process, i.e., can control the thickness of the gate oxide layer. Further, the plurality of implanting processes may use boron-containing dopants or phosphorous-containing dopants, which allows adjusting the threshold voltage of a transistor using the multi-step gate structure.

In comparison with the conventional gate having a horizontally positioned carrier channel with a channel length substantially equal to the lateral width of the gate, one embodiment of the present invention provides a multi-step gate structure having a channel length substantially equal to the summation of the lateral width and the vertical height of the multi-step gate structure. Obviously, the channel length of the multi-step gate structure is longer than that of the conventional gate, and the short channel effect can then be effectively solved. In addition, several implanting processes with different dosages and different types of dopants can be performed during the fabrication process of the multi-step structure to control the thickness of the gate oxide layer and the threshold voltage of a transistor using the multi-step gate structure.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
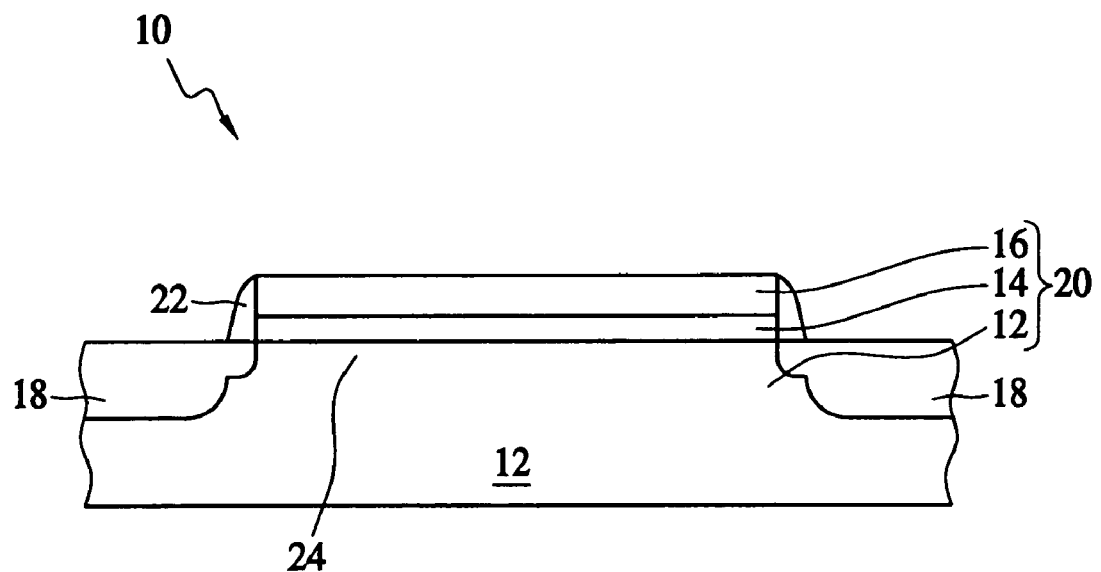
FIG. 1 illustrates a metal-oxide-semiconductor field effect transistor according to the prior art.
Figure 2:
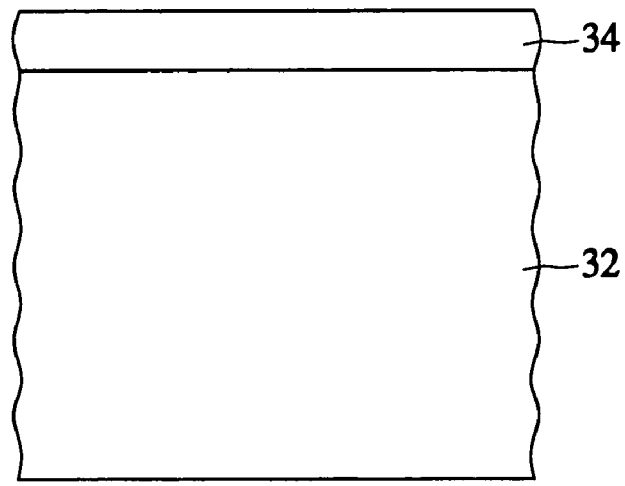
FIG. 2 to FIG. 8 illustrate a method for preparing a multi-step gate structure according to one embodiment of the present invention.
Figure 3:
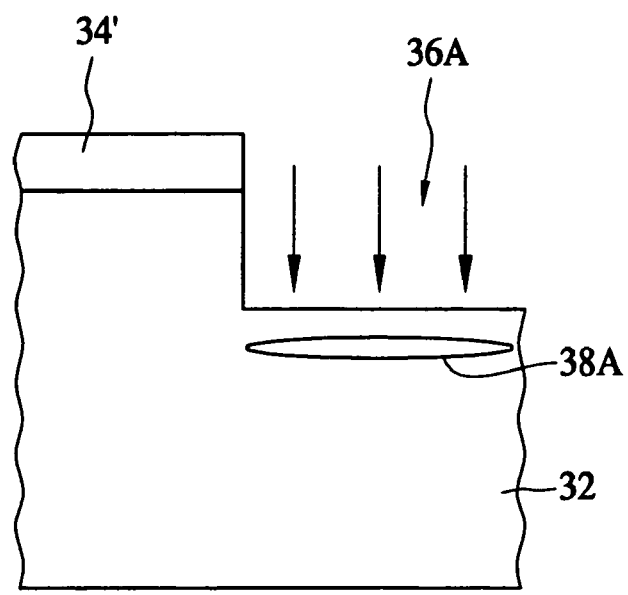

FIG. 2 to FIG. 8 illustrate a method for preparing a multi-step gate structure 30 according to one embodiment of the present invention. A mask layer 34 is formed on a semiconductor substrate 32 such as a silicon substrate, and a predetermined portion of the mask layer 34 is removed by lithographic and etching processes, while the remaining mask layer 34' covers a predetermined portion of the semiconductor substrate 32. Preferably, the mask layer 34 is made of dielectric material such as silicon oxide possessing a certain etching selectivity with respect to the silicon substrate. Subsequently, the mask layer 34' is used as an etching mask in an etching process to remove a portion of the semiconductor substrate 32 not covered by the mask layer 34' to form a first depression 36A. Preferably, an implanting process is performed to implant dopants into the semiconductor substrate 32 to form a doped region 38A under the first depression 36A, as shown in FIG. 3.

Figure 4:
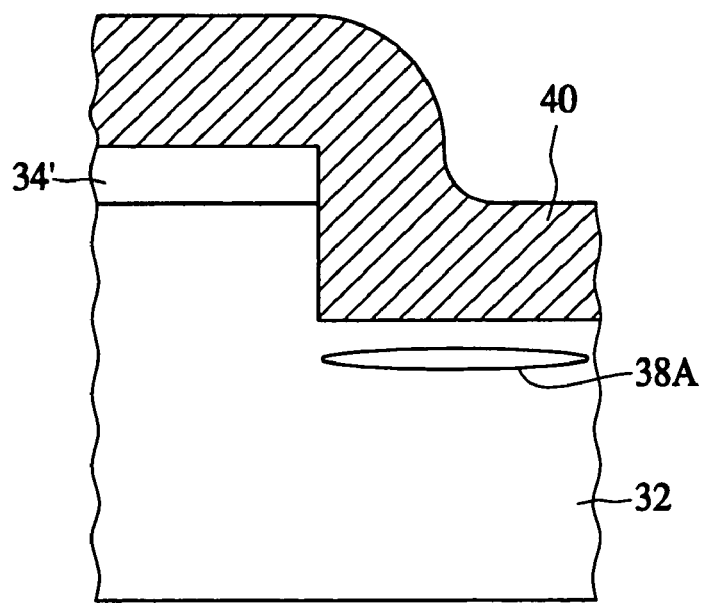

Referring to FIG. 4, a deposition process is performed to form a dielectric layer 40 on the semiconductor substrate 32, and an etching process is then performed to form a first spacer 40' on the sidewall of the first depression 36A, wherein the first spacer 40' is preferably made of dielectric material such as silicon oxide possessing a certain etching selectivity with respect to the silicon substrate. The first spacer 40' and the mask layer 34' are used as an etching mask in an etching process to remove a portion of the semiconductor substrate 32 not covered by the etching mask down to a predetermined depth to form a second depression 36B. The depth D1 of the first depression 36A is smaller than the depth D2 of the second depression 36B. Preferably, an implanting process is performed to implant dopants into the semiconductor substrate 32 to form a second doped region 38B under the second depression 36B, as shown in FIG. 5.

Figure 6:
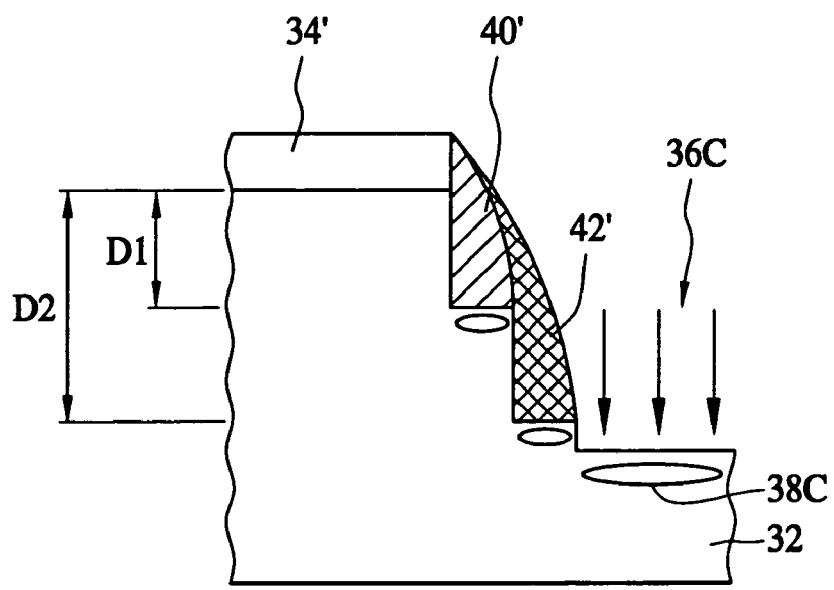

Referring to FIG. 6, a second spacer 42' is formed on the sidewall of the second depression 36B by deposition and etching processes, and the second spacer 42' is preferably made of dielectric material such as silicon oxide possessing a certain etching selectivity with respect to the silicon substrate. The mask layer 34', the first spacer 40' and the second spacer 42' are used as an etching mask in an etching process to remove a portion of the semiconductor substrate 32 not covered by the etching mask down to a predetermined depth to form a third depression 36C. Subsequently, an implanting process is performed to implant dopants into the semiconductor substrate 32 to form a doped region 38C under the third depression 36C.

Figure 7:
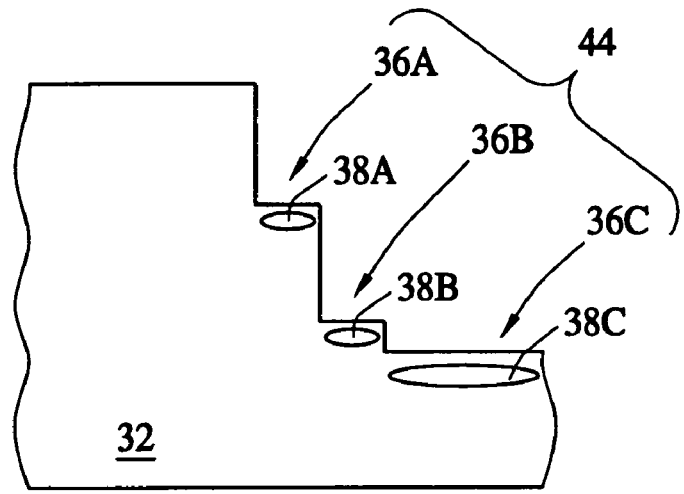
Figure 8:
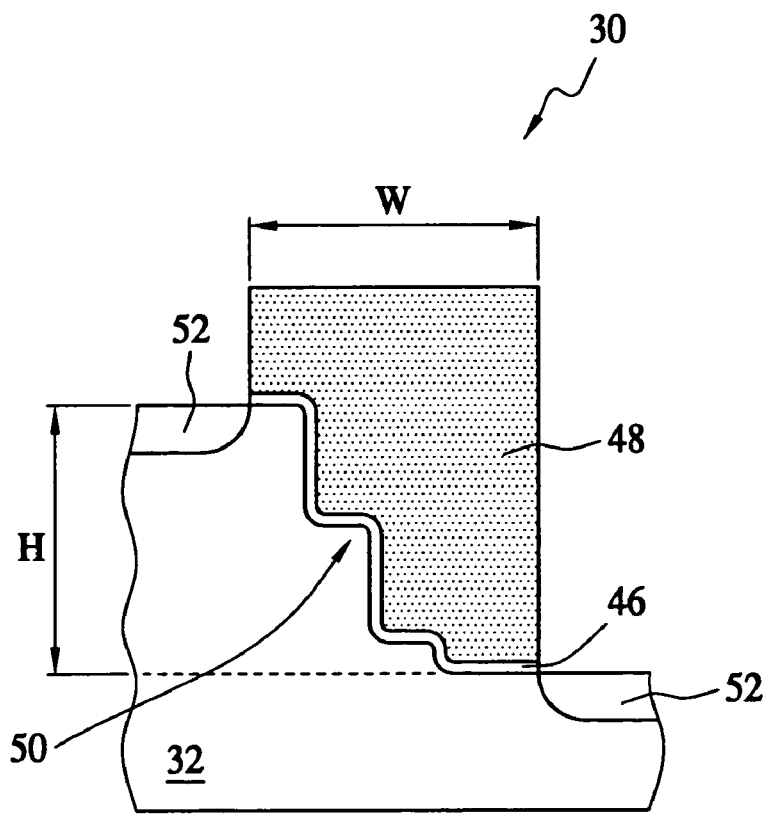
Figure 9:
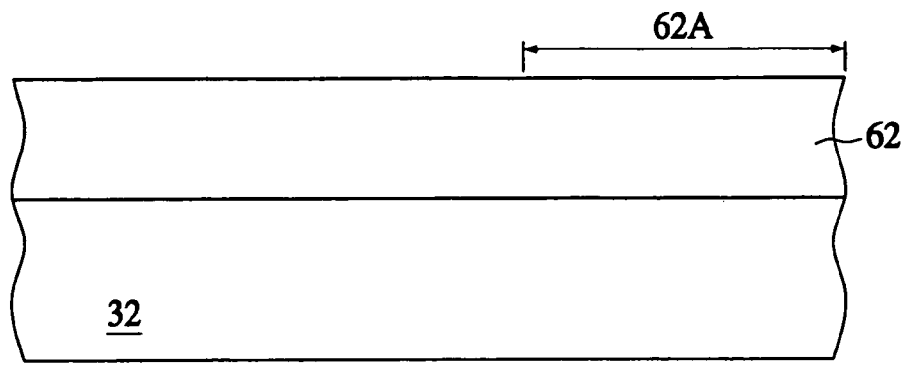
FIG. 9 to FIG. 12 illustrate a method for preparing a multi-step gate structure according to another embodiment of the present invention.

Referring to FIG. 7, the mask layer 34', the first spacer 40' and the second spacer 42' are removed by an etching process to form a multi-step structure 44 consisting of the first depression 36A, the second depression 36B and the third depression 36C. Subsequently, a thermal oxidation process is performed to form a gate oxide layer 46 on the surface of the multi-step structure 44, and a deposition process is then performed to form a conductive layer 48 on the gate oxide layer 46. The lithographic and etching processes are performed to remove a portion of the gate oxide layer 46 and the conductive layer 48 serving as a continuous multi-step gate to complete the multi-step gate structure 30, and an implanting process is then performed using the multi-step gate structure 30 as an implanting mask to form two doped regions 52 serving as a drain and a source in the semiconductor substrate 32 at two sides of the multi-step gate structure 30, as shown in FIG. 8. Particularly, there is a carrier channel 50 in the semiconductor substrate 32 under the multi-step structure 44, and the overall length of the carrier channel 50 is substantially the summation of the lateral width (W) of the lateral portion and the vertical height (H) of the vertical portion of the multi-step structure 44. The gate oxide layer 46 under the multi-step gate is continuous and the carrier channel 50 between the two doped regions 52 is continuous as well.

Figure 5:
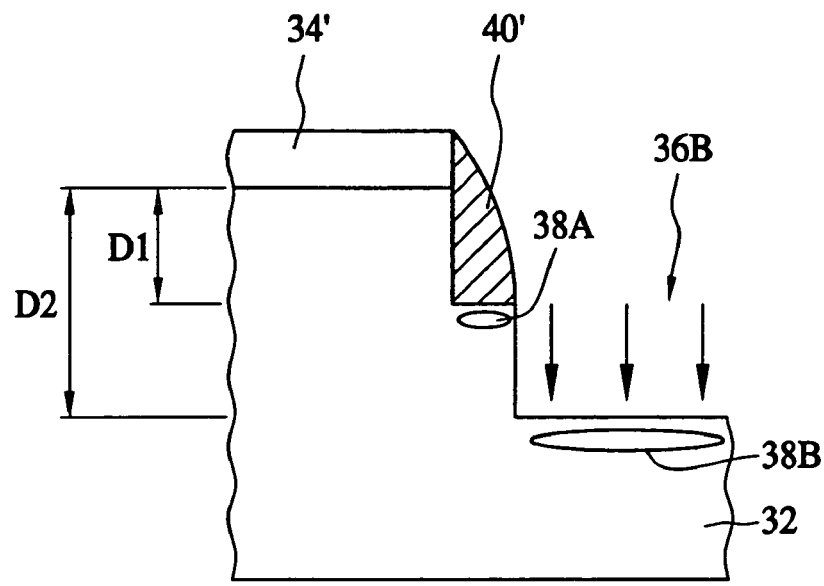

The implanting processes performed in FIG. 3, FIG. 5 and FIG. 6 may have different dosages, i.e., the dopant concentrations in the doped regions 38A, 38B and 38C may be different from one to another. These implanting processes may implant dopants not only into the semiconductor substrate 32 under the bottom surface of each depression, but also into the entire surface of each depression. These implanting processes may use nitrogen-containing dopants selected from the group consisting of ions of nitrogen atom, nitrogen gas, nitrous oxide and nitric oxide, which can inhibit the reaction rate of the subsequent thermal oxidation process, i.e., allow control of the thickness of the gate oxide layer 46 on each step surface of the multi-step structure 44. Consequently, the different dosages of nitrogen-containing dopants cause the gate oxide layer 46 to have different thicknesses on each step surface of the multi-step structure 44, i.e., the thickness of the gate oxide layer 46 on one step surface of the multi-step structure 44 may be different from that on another step surface of the multi-step structure 44, which allows control of the threshold voltage of a transistor using the multi-step gate structure 30. Instead of using nitrogen-containing dopants, these implanting processes may use boron-containing dopants or phosphorous-containing dopants, i.e., these implant processes may use different dopants. Particularly, boron-containing dopants or phosphorous-containing dopants can increase the carrier concentration in the carrier channel 50 so as to control the threshold voltage of a transistor having the multi-step gate structure 30.

Figure 10:
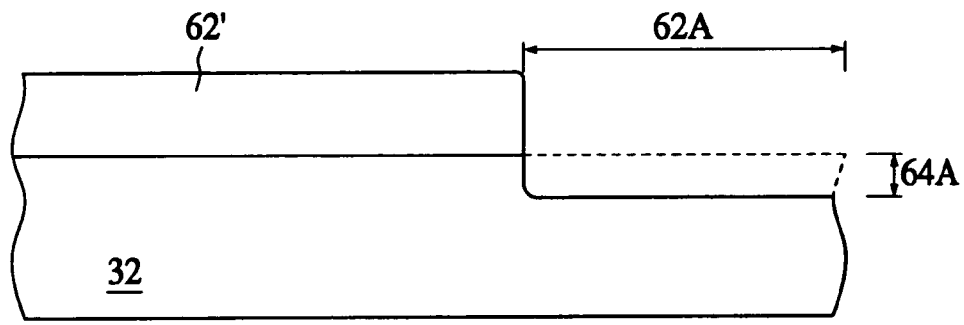

FIG. 9 to FIG. 12 illustrate a method for preparing a multi-step gate structure 60 according to another embodiment of the present invention. A mask layer 62 is formed on a semiconductor substrate 32, a predetermined portion 62A of the mask layer 62 is then removed by lithographic and etching processes, and the maintaining mask layer 62' covers a predetermined portion of the semiconductor substrate 32. Preferably, the mask layer 62 is a photoresist layer or a dielectric layer, for example, made of silicon oxide or silicon nitride. Subsequently, the mask layer 62' is used as an etching mask in an etching process to remove a portion of the semiconductor substrate 32 not covered by the etching mask 62' to form a step 64A on the semiconductor substrate 32, as shown in FIG. 10.

Figure 11:
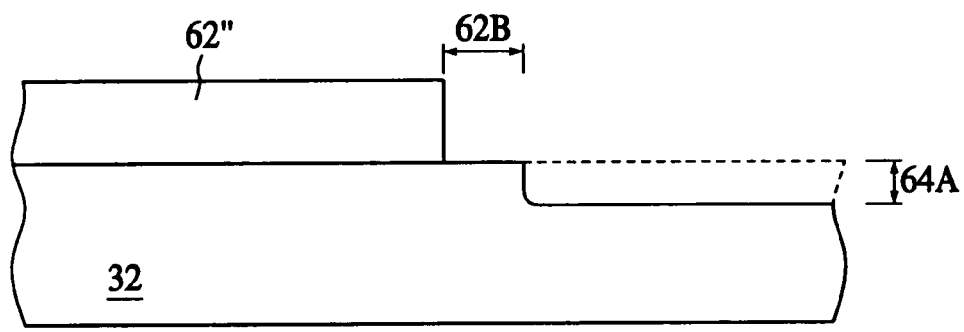
Figure 12:
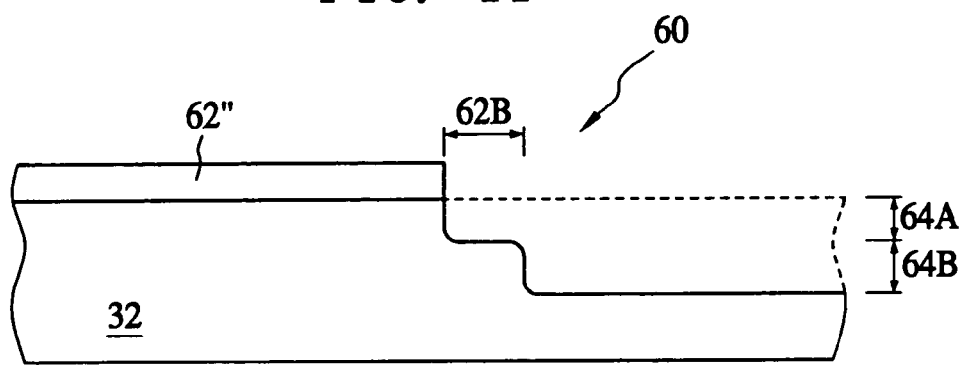

Referring to FIG. 11, a predetermined portion 62B of the mask layer 62' is removed by lithographic and etching processes to form a mask layer 62''. The mask layer 62'' is used in an etching process to remove a portion of the semiconductor substrate 32 not covered by the etching mask 62'' to form a multi-step structure 60 including two steps 64A and 64B, as shown in FIG. 12. Particularly, multi-step structures with different numbers of steps can be prepared by repeating the processes shown in FIG. 11 and FIG. 12.

In comparison with the conventional gate having a horizontally positioned carrier channel with a channel length substantially equal to the lateral width of the gate, one embodiment of the present invention provides a multi-step gate structure 30 having a carrier channel 50 with a channel length substantially equal to the summation of the lateral width (W) and the vertical height (H) of the multi-step gate structure 30. Obviously, the channel length of the multi-step gate structure 30 is longer than that of the conventional gate, and the short channel effect can then be effectively solved. In addition, several implanting processes with different dosages and dopants can be performed during the fabrication process of the multi-step structure 44 to control the thickness of the gate oxide layer 46 and the threshold voltage of a transistor using the multi-step gate structure 30.

The above-described embodiments of the present invention are intended to be illustrative only. Numerous alternative embodiments may be devised by those skilled in the art without departing from the scope of the following claims.

What is claimed is:

1. A method for preparing a transistor having a multi-step gate structure, comprising the steps of:

forming a semiconductor substrate having a multi-step structure, including:

forming a mask layer covering a predetermined portion of the semiconductor substrate;

etching the semiconductor substrate using the mask layer as a first etching mask to form a first depression;

forming a first spacer on a sidewall of the first depression;

etching the semiconductor substrate using the mask layer and the first spacer as a second etching mask to form a second depression; and removing the mask layer and the first spacer;

performing a thermal oxidation process to form a gate oxide layer covering the entire surface of the multi-step structure;

forming a conductive layer on the gate oxide layer;

removing a portion of the conductive layer to form a multi-step gate on the gate oxide layer, wherein the gate oxide layer under the multi-step gate is continuous; and wherein at least one first implanting process is performed before the forming of the gate oxide layer to implant nitrogen-containing dopants into a portion of the semiconductor substrate under the multi-step structure so as to control the thickness of the gate oxide layer by inhibiting the reaction rate of the thermal oxidation process to form the gate oxide layer.

2. The method for preparing a transistor having a multi-step gate structure of claim 1, wherein a plurality of first implanting processes are performed to implant the nitrogen-containing dopants into the semiconductor substrate under the multi-step structure.

3. The method for preparing a transistor having a multi-step gate structure of claim 2, wherein the plurality of first implanting processes are performed with different dosages.

4. The method for preparing a transistor having a multi-step gate structure of claim 2, wherein the plurality of first implanting processes use different types of nitrogen-containing dopants.

5. The method for preparing a transistor having a multi-step gate structure of claim 2, wherein the nitrogen-containing dopants are selected from the group consisting of ions of nitrogen atom, nitrogen gas, nitrous oxide, and nitric oxide.

6. The method for preparing a transistor having a multi-step gate structure of claim 1, wherein the first implanting process implant the nitrogen-containing dopants into the semiconductor substrate under the first depression before forming a first spacer on a sidewall of the first depression.

7. The method for preparing a transistor having a multi-step gate structure of claim 1, wherein the first implanting process implant the nitrogen-containing dopants into the semiconductor substrate under the second depression.

8. The method for preparing a transistor having a multi-step gate structure of claim 1, further comprising the steps of:

forming a second spacer on a sidewall of the second depression; and etching the semiconductor substrate using the mask layer, the first spacer and the second spacer as a third etching mask to form a third depression.

9. The method for preparing a transistor having a multi-step gate structure of claim 1, further comprising a step of performing a second implanting process using the multi-step gate as an implanting mask to form two doped regions at two sides of the multi-step gate and a continuous carrier channel in the semiconductor substrate, wherein the continuous carrier channel is formed under the multi-step gate and between the two doped regions.

10. The method for preparing a transistor having a multi-step gate structure of claim 9, wherein the continuous carrier channel includes at least one lateral portion and at least one vertical portion.

* * * * *